United States Patent [19]

Lingstaedt

[11] Patent Number: 4,570,131
[45] Date of Patent: Feb. 11, 1986

[54] PLL CIRCUIT WITH SELECTABLE CURRENT CHARGING

[75] Inventor: Ernst L. Lingstaedt, Munich, Fed. Rep. of Germany

[73] Assignee: SGS-ATES Deutschland Halbleiter Bauelemente GmbH, Munich, Fed. Rep. of Germany

[21] Appl. No.: 559,201

[22] Filed: Dec. 7, 1983

[30] Foreign Application Priority Data

Dec. 14, 1982 [DE] Fed. Rep. of Germany ....... 3246291

[51] Int. Cl.$^4$ .............................................. H03L 7/00
[52] U.S. Cl. ..................................... 331/36 C; 331/8; 331/17; 331/34
[58] Field of Search ....................... 331/1 A, 8, 17, 25, 331/34, 36 C, 177 R, 177 V, 108 C

[56] References Cited

U.S. PATENT DOCUMENTS 3,714,463  1/1973  DeLaune ............................. 307/232
3,924,202  12/1975  Craft ..................................... 331/8 X

FOREIGN PATENT DOCUMENTS 55-10238  1/1980  Japan.

Primary Examiner—Eugene R. Laroche
Assistant Examiner—Robert J. Pascal
Attorney, Agent, or Firm—Perman & Green

[57] ABSTRACT

A PLL circuit arrangement comprising a voltage controlled oscillator, the frequency of which is determined by the alternating charging and discharging of a capacitor, and a phase comparator, to a first input of which the output signal of the voltage controlled oscillator is supplied and to a second input of which a reference signal is supplied and from the output signal of which the signal controlling the oscillator is derived, wherein the capacitor can be charged by means of a current source circuit having a current intensity which can be switched over, the current intensity of the current source circuit can be switched over to a different value during each charging process, and wherein the moment of switching over of the current source circuit can be changed as a function of the output signal of the phase comparator.

10 Claims, 3 Drawing Figures

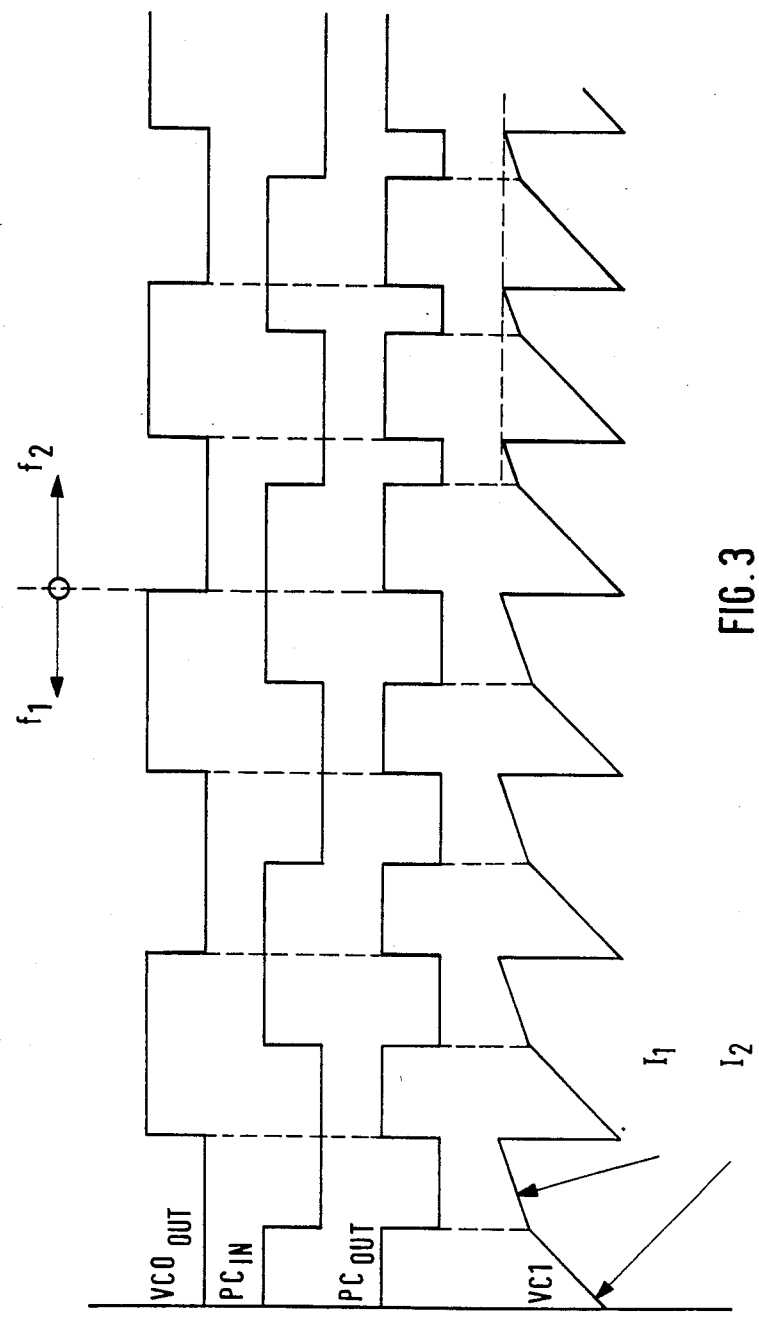

PLL CIRCUIT WITH SELECTABLE CURRENT CHARGING

FIELD OF THE INVENTION

The invention relates to a phase-locked loop (PLL) circuit arrangement comprising a voltage controlled oscillator, a phase comparator, to a first input of which the output signal of the voltage controlled oscillator is supplied and to a second input of which a reference signal is supplied and from the output signal of which the signal controlling the oscillator is derived, and a capacitor which acts on the oscillator frequency and the charging voltage of which can be influenced by a current source circuit adapted to be switched over in response to the output signal of the phase comparator.

BACKGROUND OF THE INVENTION

In PLL circuits the phases of two signals are synchronized with each other in a closed control loop. Conventional circuits of this type are constructed in the manner indicated in FIG. 1. A voltage controlled oscillator (VCO) issues an output signal which, on the one hand, is present as the output signal at an output terminal $VCO_{OUT}$ and which, on the other hand, is supplied to an input of a phase comparator PC. A reference signal, with the frequency and phase of which the voltage controlled oscillator VCO is to be synchronized, is supplied to a second input $PC_{IN}$ of the phase comparator PC. The output of the phase comparator PC is followed by a RC low pass filter circuit whose output signal, which is dependent upon the phase comparison in the phase comparator PC, is supplied to the voltage controlled oscillator VCO as a control signal.

A PLL circuit of the type indicated at the beginning, which is known for U.S. Pat. No. 3,714,463, comprises a phase comparator having two output terminals controlling one current source each. Depending on whether the phase of the output signal of the voltage controlled oscillator is equal to the phase of the reference signal, is leading in respect of the latter or lagging in respect of the latter, the capacitor belonging to a RC low pass filter circuit is held at a mean voltage value or is charged or discharged further in a pulse-like manner by opening in a pulse-like manner the one or the other current source respectively. Such a PLL circuit is also shown in the Patents Abstracts of Japan, No. 55-10238(A).

Due to the fact that the RC low pass filter circuit has to have a large time constant, a capacitor C with large capacitance and a resistor R with large resistance are required in general. Especially the necessity of a capacitor C with large capacitance makes it more difficult to accommodate the low pass filter circuit in a monolithic integrated circuit. A very large semiconductor chip area would be needed for such a capacitor.

SUMMARY OF THE INVENTION

It is the object of the invention to provide a PLL circuit arrangement which can be integrated in a considerably easier manner.

This object is met by a PLL circuit arrangement comprising a voltage controlled oscillator, a phase comparator, to a first input of which the output signal of the voltage controlled oscillator is supplied and to a second input of which a reference signal is supplied and from the output signal of which the signal controlling the oscillator is derived, and a capacitor which acts on the oscillator frequency and the charging voltage of which can be influenced by a current source circuit adapted to be switched over in response to the output signal of the phase comparator, with said PLL circuit arrangement being characterized in that the capacitor is a frequency-determining element of the voltage controlled oscillator and can, with a periodicity determining the oscillator frequency, be charged by means of the current source circuit and be discharged again upon reaching a predetermined charging voltage threshold value, that the current intensity of the current source circuit can be switched over to a different value during each charging process, and in that the moment of switching over of the current source circuit can be changed as a function of the output signal of the phase comparator.

This PLL circuit arrangement avoids a low pass filter in the control loop, so that the capacitor C is not required any more. What is used is the capacitor belonging to the voltage controlled oscillator, which is provided anyway and which has a capacitance which is by one to two orders of magnitude smaller than that of the capacitor of the conventional low pass filter. When the voltage controlled oscillator has a frequency of 100 kHz, the capacitor thereof usually has values in the range of 10 to 20 pF. Such a capacitor can still be accommodated without problems in a monolithic integrated semiconductor circuit. However, the capacitor of the conventional low pass filter has a capacitance of several 100 pF to several nF. U.S. Pat. No. 3,714,463 even mentions a typical value of 1 $\mu F$ for the capacitor of the low pass filter. A capacitor having such a capacitance can practically not be integrated, since it would occupy too much of the semiconductor area of the integrated circuit.

In the PLL circuit arrangement according to the invention, the current source circuit preferably can be switched down to a reduced current value during each charging process.

In a particularly preferred embodiment of the invention, the current source circuit comprises two current sources with different current intensities, which are connected in parallel, with the current source with the larger current intensity having connected in series therewith a switching transistor the control terminal of which is connected to the output of the phase comparator. During charging of the capacitor of the voltage controlled oscillator, this current source is switched off with the aid of the switching transistor. Thus, a periodic saw-tooth voltage is generated across the capacitor, the period of which is dependent upon the output signal of the phase comparator.

In a particularly advantageous further development of the invention the capacitor is interconnected between a supply voltage source and a circuit junction to which are connected the output of the current source circuit, the input of a threshold circuit and a second controllable switch bridging the capacitor, with the control terminal of said second controllabe switch being connected to the output of the threshold circuit. In this further development the periodic saw-tooth signal of the voltage controlled oscillator is generated in that, when the capacitor voltage reaches a specific threshold value, the threshold circuit issues an output signal which switches the second switching transistor on, whereby the two electrodes of the capacitor are short-circuited and the capacitor is discharged very quickly.

In the most preferred further development of the PLL circuit arrangement according to the invention, the threshold circuit is followed by an inverter the output signal of which controls the second switching transistor for discharging the capacitor and is, furthermore, applied to a pulse shaping circuit which issues at its output a pulse sequence with a duty cycle of 50 percent. In this development the phase comparator is constituted by an EXCLUSIVE-OR circuit to the two inputs of which the pulse sequence issued by the pulse shaping circuit and respectively the reference signal is supplied and the output of which controls the switching transistor switching the one current source.

BRIEF DESCRIPTION OF THE DRAWINGS

The invention, advantages of the invention and further developments of the invention will now be described in more detail by way of an especially preferred embodiment with reference to the accompanying drawings in which:

FIG. 3 signal shapes occurring at various locations of the PLL circuit arrangement illustrated in FIG. 2.

DETAILED DESCRIPTION OF THE INVENTION

Figure 1:
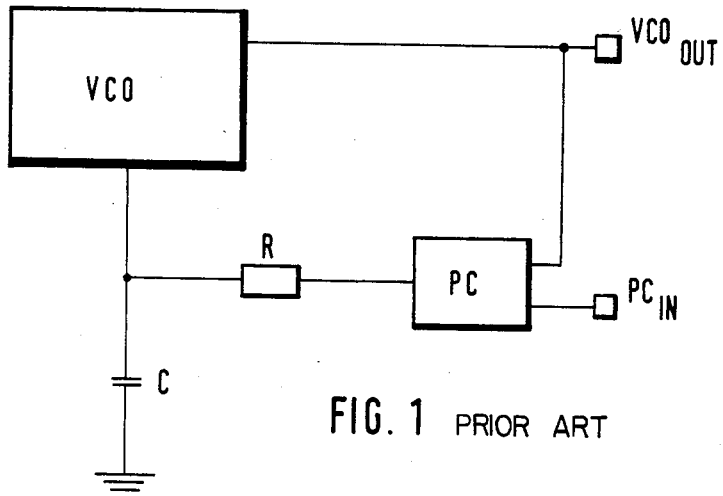
FIG. 1 shows the block diagram of a conventional PLL circuit arrangement having a low pass filter in the control loop.
Figure 2:
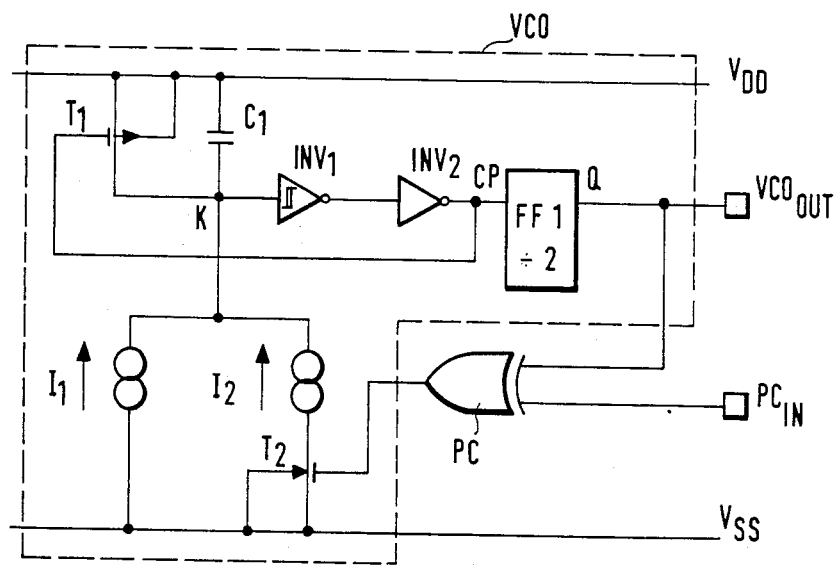
FIG. 2 an embodiment of the PLL circuit arrangement according to the invention.

The embodiment of a PLL circuit arrangement according to the invention, which is shown in FIG. 2, comprises a voltage controlled oscillator VCO which is encircled by a broken line, and a phase comparator PC which is constituted by an EXCLUSIVE-OR circuit. The voltage controlled oscillator VCO includes, as frequency-determining element, a capacitor C1 which is interconnected between a first supply voltage source $V_{DD}$ and a circuit junction K. To said circuit junction, the common terminal of two current sources I1 and I2 connected in parallel is connected, which are on the other end connected to a second supply voltage suource $V_{SS}$ each. The current source I2 supplies current of greater intensity than the current source I1. A switching transistor T2 is connected in series with the current source I2. In the embodiment shown in FIG. 2, this switching transistor T2 is a field effect transistor. The gate terminal thereof is connected to the output of the phase comparator PC.

The capacitor C1 is bridged by a second switching transistor T1 which, in the embodiment in question, is also a field effect transistor. This second switching transistor T1 is with its main path connected in parallel to the capacitor C1, viz. on the one end to the first supply voltage source $V_{DD}$ and on the other end to the circuit junction K. Connected to the circuit junction K is, furthermore, the input of a threshold inverter INV1, which is followed by an inverter INV2. The output of the inverter INV2 is connected to the gate terminal of the second switching transistor T1. The output signal of the inverter INV2 is branched at a circuit point CP and is applied on the one hand to the gate terminal of the second switching transistor T1 and on the other hand to the input of a frequency dividing circuit which divides the frequency by two and is provided in the form of a flipflop circuit FF1. The output Q of the flipflop circuit FF1 is connected on the one hand to the output terminal $VCO_{OUT}$ of the voltage controlled oscillator VCO and on the other hand to the one input of the EXCLUSIVE-OR circuit PC. The second input thereof is connected to the reference signal input terminal $PC_{IN}$.

The mode of operation of this PLL circuit arrangement is now elucidated with the aid of FIG. 3.

When the previously discharged capacitor C1 is being charged by the current source circuit containing the current sources I1 and I2 connected in parallel, the voltage VC1 across the capacitor C1 sometimes reaches a switching threshold value, and when this switching threshold value is exceeded the switching inverter INV1 issues an output signal. The output signal of the threshold inverter INV1 is inverted by the inverter INV2. This inverted signal controls or switches the switching transistor T1 into the conductive state. Thus, a very rapid discharge of the capacitor C1 results. After the discharge of the capacitor C1, which causes the switching transistor T1 to switch over into the off-state, a new charging cycle can commence. The pulses occurring at the circuit point CP represent the output signal of the voltage controlled oscillator proper.

However, due to the fact that for the phase comparison in the EXCLUSIVE-OR circuit PC a pulse sequence with a duty cycle of 50 percent is desirable, the voltage controlled oscillator proper is extended by the flipflop circuit FF1 the output of which provides a pulse sequence with the desired duty cycle of 50 percent. Thus, at the output Q of the flipflop circuit FF1 a pulse signal of the type indicated in FIG. 3 at the top is available which forms at the same time the output signal of the voltage controlled oscillator and also of the PLL circuit arrangement.

The pulse signal which is shown in second place in FIG. 3 is supplied across the input terminal $PC_{IN}$ of the PLL circuit arrangement. The pulse signal supplied to the phase comparator PC from the voltage controlled oscillator VCO is out-of-phase with respect to the reference pulse signal. Due to this phase difference, an output pulse sequence is generated at the output of the EXCLUSIVE-OR circuit, by means of which sequence the current source I2 is periodically switched on and off. This means that the current supplied by the current source I2 is modulated as a function of the result of the phase comparison.

A pure saw-tooth voltage would be created across the capacitor C1, if the current source I2 were always switched on, i.e., if the capacitor C1 were always charged with the current sum I1+I2. Due to the modulation of I2 by switching the switching transistor T2 on and off, the capacitor C1 is, however, successively charged with two different saw-tooth slopes within one saw-tooth cycle. Thus, a bent saw-tooth course results as it is shown in FIG. 3 at the bottom. The first, steeper saw-tooth slope is defined by the current sum I1+I2, whereas the second, less steep saw-tooth slope is defined by the current I1 alone, when I2 is switched off. The longer the time of I2 being switched on, the shorter the time required to charge the capacitor C1 to the switching threshold value of the threshold inverter INV1, and hence a higher output frequency of the voltage controlled oscillator VCO is obtained. The ratio of I2/I1 defines the "loop gain", i.e. the amount of frequency change for a given change of the duty cycle of the phase comparator output signal.

FIG. 3 shows signal courses for two different frequencies $f_1$ and $f_2$. With the initially occurring frequency $f_1$ there is a phase difference of 90° between the reference signal at the input terminal $PC_{IN}$ and the oscillator output signal at the output terminal $VCO_{OUT}$. This results in a duty cycle of the output signal $PC_{OUT}$ of the phase comparator PC of 50 percent. When increasing to the frequency f2, the phase relation between the reference signal and the oscillator output signal changes, and the duty cycle at the output of the phase comparator PC changes accordingly. In this case, the capacitor C1, in each charging cycle, is charged longer with the current sum I1+I2, and therefore the switching threshold value is reached earlier and a higher frequency is issued at the oscillator output $VCO_{OUT}$.

On the basis of conventional PLL circuit arrangements, the present specification speaks of a voltage controlled oscillator VCO. However, it would be more correct to speak of a "duty cycle controlled oscillator". For, the oscillator frequency depends directly upon the duty cycle of the phase comparator output signal.

If a preferred embodiment, I1 and I2 are adjusted by means of an external resistor via a current mirror in order to tune the center frequency of the voltage controlled oscillator VCO.

Furthermore, it should be pointed out that this type of PLL circuit arrangement can work correctly only when a phase comparison is carried out in every clock period of the voltage controlled oscillator VCO. In contrast thereto this PLL circuit cannot be used when a phase comparison is carried out only every n-th VCO clock cycle (with n being greater than 1), as it would be the case e.g. for a frequency synthesizer circuit.

It is apparent that there has been provided in accordance with this invention a PLL circuit arrangement which fully satisfies the objects, means, and advantages set forth hereinbefore. While the invention has been described in combination with the specific embodiment thereof, it is evident that many alternatives, modifications, and variations will be apparent to those skilled in the art in the light of the foregoing description. Accordingly, it is intended to embrace all such alternatives, modifications, and variations as fall within the spirit and broad scope of the appended claims.

I claim:

1. A PLL circuit arrangement comprising:
   a voltage controlled oscillator;
   a phase comparator having a first input terminal which receives the output signal of the voltage controlled oscillator and a second input terminal which receives a reference signal, an output of the comparator being coupled to a control input terminal of the voltage controlled oscillator;
   a capacitor provided in the voltage controlled oscillator, the capacitor being alternately charged and discharged with a periodicity determining the frequency of the voltage controlled oscillator;
   a multiple-tier current source circuit coupled to the capacitor for charging the capacitor, the current source circuit comprising a plural number of current source means connected in parallel for applying charging current to the capacitor, at least one of which source means includes a first controllable switch for altering a flow of current, the controllable switch having a control terminal which is connected to the output of the phase comparator, the switching state of the controllable switch being changed by an output signal of the phase comparator during each charging process at a time dependent on the difference in phase between signals at the input terminals of the phase comparator; and
   a discharge means coupled to the capacitor for discharging the capacitor when the charging voltage has reached a predetermined threshold.

2. A PLL circuit arrangement according to claim 1, wherein the controllable switch is switched on during each charging process.

3. A PLL circuit arrangement according to claim 1 or 2, wherein said one current source means comprises a current source connected in series with said controllable switch; and wherein the controllable switch is switched off during each charging process.

4. A PLL circuit arrangement according to claim 3, wherein the current source circuit comprises two of the current source means, and wherein said controllable switch comprises a switching transistor whose gate or base is connected to the output of the phase comparator, said one current source means having the switching transistor providing a larger current intensity than the other of the two current source means.

5. A PLL circuit arrangement according to claim 1, wherein said oscillator includes a threshold circuit, and said discharge means includes a controllable switch; and wherein
   the capacitor is interconnected between a supply voltage source and a circuit junction to which are connected an output terminal of the current source circuit, an input of the threshold circuit and the second-mentioned controllable switch which bridges the capacitor; and wherein
   a control terminal of the second controllable switch is connected to the output of the threshold circuit.

6. A PLL circuit arrangement according to claim 5, wherein the second controllable switch comprises a second switching transistor whose main path is connected in parallel to the capacitor and whose gate or base terminal is connected to the output of the threshold circuit.

7. A PLL circuit arrangement according to claim 5 or 6, wherein the oscillator comprises a pulse shaping circuit which issues at its output a pulse sequence with a duty cycle of 50 percent, said pulse sequence constituting the output signal of the voltage controlled oscillator and being supplied to the first input of the phase comparator; and wherein
   the threshold circuit comprises a threshold inverter which is followed by a second inverter, an output terminal of the second inverter being connected to the control terminal of the second switching transistor and to the pulse shaping circuit.

8. A PLL circuit arrangement according to claim 7, wherein the pulse shaping circuit comprises a frequency dividing circuit.

9. A PLL circuit arrangement according to claim 8, wherein the phase comparator comprises an EXCLUSIVE-OR circuit having one input terminal receiving the output signal of the pulse shaping circuit and a second input terminal receiving the reference signal, the output of the EXCLUSIVE-OR circuit being connected to the control terminal of the switching transistor of the current source circuit.

10. A PLL circuit arrangement according to claim 9 wherein said frequency divider circuit is constructed in the form of a flipflop.

* * * * *